United States Patent [19]
Ackerman

[11] Patent Number: 5,977,812
[45] Date of Patent: Nov. 2, 1999

[54] CIRCUIT AND METHOD FOR PROVIDING A GENERALLY LOG LOGARITHMIC TRANSFER FUNCTION

[75] Inventor: Jay E. Ackerman, Windsor, Colo.

[73] Assignee: LSI Logic Corporation, Milpitas, Calif.

[21] Appl. No.: 09/074,836

[22] Filed: May 8, 1998

[51] Int. Cl.[6] .................................................. H03G 11/08
[52] U.S. Cl. .......................................... 327/350; 327/352
[58] Field of Search .................................. 327/350, 351, 327/352, 346

[56] References Cited

U.S. PATENT DOCUMENTS

| | | | |
|---|---|---|---|
| 4,064,506 | 12/1977 | Murgen et al. | 340/347 |
| 4,734,751 | 3/1988 | Hwang et al. | 327/404 |
| 5,258,759 | 11/1993 | Cauwenberghs et al. | 341/150 |
| 5,327,128 | 7/1994 | Lee | 341/102 |
| 5,508,702 | 4/1996 | Estrada et al. | 341/136 |
| 5,515,260 | 5/1996 | Watanabe et al. | 363/73 |
| 5,631,648 | 5/1997 | Yamada et al. | 341/138 |
| 5,677,561 | 10/1997 | Jensen | 327/350 |
| 5,734,284 | 3/1998 | Popescu | 327/283 |

OTHER PUBLICATIONS

A Low–Power CMOS VGA for 50 Mb/s Disk Drive Read Channels; IEEE Transactions on Circuits and Systems II: Analog and Digital Signal Processing, vol. 42, No. 6, Jun. 1995; pp. 370–376.

*Primary Examiner*—Toan Tran

[57] ABSTRACT

A circuit and method for generating a generally logarithmic transfer function based upon switching signals. The circuit includes a plurality of transistors and a switch operatively connected to each transistor in the programmable set. A line is in communication with each switch for carrying switching signals thereto thereby selecting which of the transistors will contribute to the generally logarithmic function. Preferably, the circuit is a portion of a programmable gain amplifier, and a digital code controls the gain. The gain can be generally logarithmic as a result of which transistors which are selected to contribute to the generally logarithmic transfer function. For example, there may be a plurality of sets of transistors where the values of the transistors in each set are such that when all the transistors of the set are selected to contribute to the generally logarithmic gain, the set of transistors provides a gain having a value approaching m. Each of the transistors in the set has a value which is generally a multiple of ½ m.

20 Claims, 3 Drawing Sheets

CIRCUIT AND METHOD FOR PROVIDING A GENERALLY LOG LOGARITHMIC TRANSFER FUNCTION

The present invention relates generally to devices which provide logarithmic transfer functions, and more specifically relates to a circuit for generating a generally logarithmic transfer function using a plurality of transistors.

BACKGROUND OF THE INVENTION

It is desirable to be able to provide a logarithmic transfer function within certain applications. For example, it is desirable to be able to provide a logarithmic transfer function with an automatic gain control loop because having a logarithmic or exponential gain characteristic "linearizes" equations which are used to calculate bandwidth. In other words, the loop bandwidth is made constant with respect to gain. As a result, it is easier to compensate the loop to guarantee stability.

Unfortunately, it is difficult to provide a logarithmic transfer function in a complementary metal oxide semiconductor (CMOS) device because these devices have a square law characteristic. In contrast, a bipolar device, for example, has a current-to-input voltage relationship which is exponential. While a CMOS device will have a current-to-input voltage relationship which is exponential at very low currents, this is not a viable option for circuitry which requires a bandwidth above the 1 MHZ range.

The present invention is directed to provide a transfer function which is generally logarithmic and which can be employed in a CMOS device such as in a programmable gain amplifier.

OBJECTS AND SUMMARY

It is an object of the present invention to provide a generally logarithmic transfer function using a plurality of transistors.

It is a further object of the present invention to provide a generally logarithmic gain controlled by a digital code.

It is a further object of the present invention to provide that a generally logarithmic transfer function can be achieved with CMOS devices.

In accordance with these and other objects, the present invention provides a circuit and method for generating a generally logarithmic transfer function based upon switching signals. The circuit includes a plurality of transistors and a switch operatively connected to each transistor. A line is in communication with each switch thereby selecting which of the transistors contribute to the transfer function.

Preferably, the circuit is a portion of a programmable gain amplifier, and digital code controls the gain. The gain can be generally logarithmic as a result of which transistors are selected to contribute to the gain. For example, there may be two sets of transistors where the values of the transistors in each set are such that when all the transistors of the set are selected to contribute to the generally logarithmic gain, the set of transistors provides a gain having a value approaching m. Each of the transistors in the set has a value which is generally a multiple of ½ m.

By providing as such, it is possible to select certain desired transistors based upon their values such that a generally logarithmic transfer function is achieved.

BRIEF DESCRIPTION OF THE DRAWINGS

The present invention and the advantages thereof will become more apparent upon consideration of the following detailed description when taken in conjunction with the accompanying drawings of which.

DETAILED DESCRIPTION OF AN EMBODIMENT OF THE INVENTION

Figure 1:
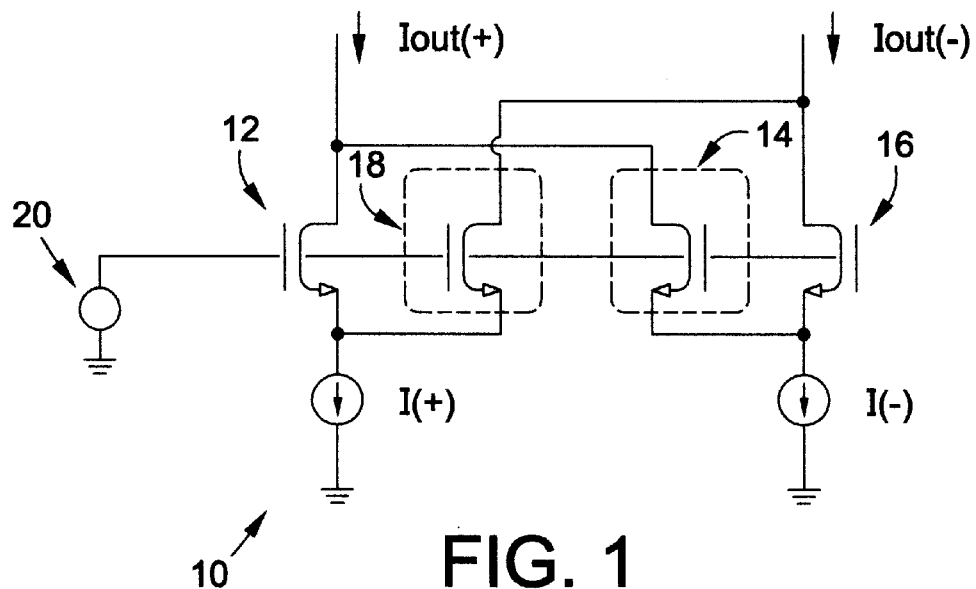
FIG. 1 is a schematic diagram of a circuit in accordance with an embodiment of the present invention.
Figure 4:
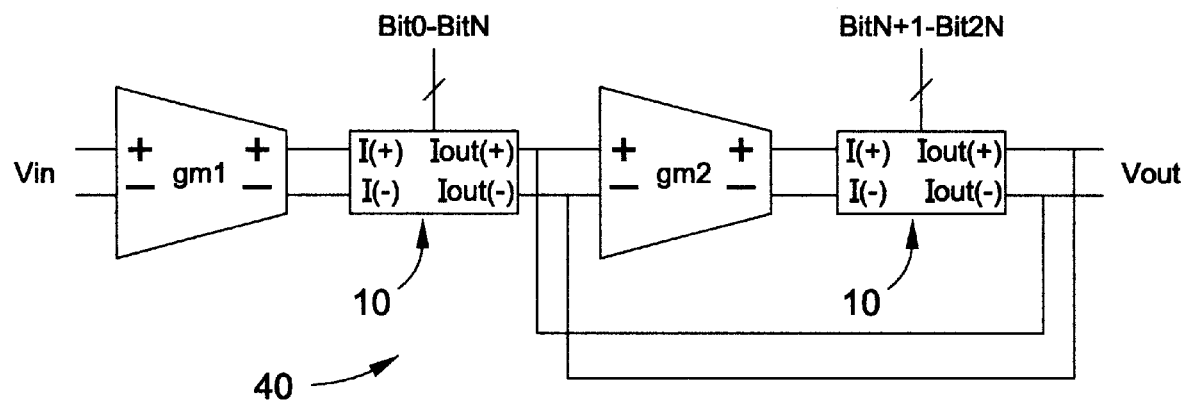
FIG. 4 is a schematic diagram of a programmable gain amplifier employing the circuit illustrated in FIG. 1.

FIG. 1 is a schematic diagram of a circuit 10 in accordance with an embodiment of the present invention. The circuit 10 can provide a generally logarithmic transfer function. Preferably, the circuit 10 is employed within a programmable gain amplifier (PGA) as illustrated in FIG. 4, and provides a generally logarithmic gain. However, the circuit 10 may be employed in other devices, such as in other types of CMOS devices. As mentioned, it is desirable, yet it has been difficult, to be able to provide a logarithmic transfer function within a CMOS environment.

As shown in FIG. 1, the circuit 10 includes two inputs, I(+) and I(−), for receiving currents from a previous stage. The first input, I(+), is connected to a transistor 12 which preferably provides a unit (1) value. The first input, I(+), is also connected to a programmable device 14. Likewise, the second input, I(−), is connected to a transistor 16 which preferably provides a unit (1) value, and is connected to a programmable device 18. Each of the transistors 12 and 16 and programmable devices 14 and 18 are connected to a bias voltage source 20 which ensures that they operate within a proper operating range.

Figure 2:
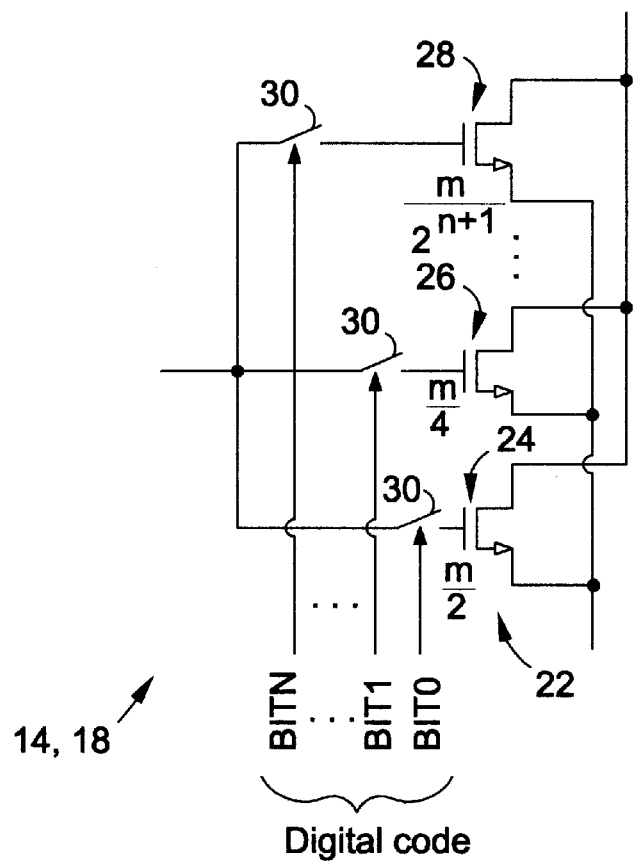
FIG. 2 is a schematic diagram of either of the encircled portions of the circuit illustrated in FIG. 1, illustrating the individual components thereof.

Preferably, the programmable devices 14 and 18 are identical. Each programmable device may be constructed as shown in FIG. 2, and may include a set 22 of several transistors 24, 26 . . . 28 arranged parallel to each other. As shown, it is preferred that each transistor of the set 22 has a different value and is generally a multiple of ½ m (m/2, m/4, m/8, m/16, etc.). Each transistor is connected to a corresponding switch 30, and each switch is operatively controlled by a bit line. The bit lines carry switching signals for controlling the actuation of the switches 30 and effectively selecting corresponding transistors to contribute to the value provided by the set 22. More specifically, the bit lines preferably carry a digital code—a digital word which is communicated to the circuit 10 through the bit lines, BIT 0–BIT N. By providing that each of the transistors of the set 22 has a different value and is generally a multiple of ½ m (m/2, m/4, etc.), if all the switches 30 of the set 22 of transistors were closed, the value achieved by the set 22 would approach the value m. On the other hand, if all the switches 30 were held open, the value achieved by the set 22 would be zero.

As mentioned, each input, I(+) and I(−), is not only connected to a set 22 of parallel transistors, but is also connected to a transistor 12 and 16, respectively, which preferably provides a unit (1) value. Each set 22 of parallel transistors (of programmable devices 14 and 18) and unit (1) value transistor is connected to an output, $I_{out}(+)$ and $I_{out}(-)$, for carrying differential signal currents from the circuit 10. Due to the unit (1) value transistors and two sets 22 (of programmable devices 14 and 18) of parallel transistors, the transfer function realized between the first input, I(+), and the first output, $I_{out}(+)$, is provided by the following function:

$$I_{out}(+)=[(I(+)+x*I(-))/(1+x)] \quad (A)$$

Likewise, the transfer function realized between the second input, I(−), and the second output, $I_{out}(-)$ is provided by the following function:

$$I_{out}(-)=[(I(-)+x*I(+))/(1+x)] \quad (B)$$

If I(−)=−1*I(+), then $$I_{out}(+)=I(+)*(1-x)/(1+x), \text{ and} \quad (C)$$

$$I_{out}(-)=I(-)*(1-x)/(1+x). \quad (D)$$

In the above two equations, (A), (B), (C) and (D), the value of x depends on which switches 30 are closed and which are held open. Therefore, the circuit 10 provides that the digital code, by controlling the switches 30, controls the value of x in the equations, and the ratio of signal current in to signal current out (the gain).

If all the switches 30 are closed, the value x approaches the value m, and the gain between the inputs, I(+) and I(−), and outputs, $I_{out}(+)$ and $I_{out}(-)$, will approach [(1−m)/(1+m)]. If all the switches 30 are held open, the value x will equal zero, and the gain between the inputs, I(+) and I(−), and outputs, $I_{out}(+)$ and $I_{out}(-)$, will be a unit gain (1) due to the unit transistors 12 and 16.

As an example, if only the switches 30 relating to the first two transistors in each set of parallel transistors are closed, then x in equations (A) and (B) will be equal to [m/2+m/4, or ¾ m]. Therefore, the gain would be equal to [(1−¾ m)/(1+¾ m)]. As another example, if only the switches 30 relating to the third and the fourth transistors in each set of parallel transistors are closed, then x in equations (A) and (B) will be equal to [m/8+m/16, or (3/16)m]. Therefore, the gain would be equal to [(1−(3/16)m)/(1+(3/16)m)].

Figure 3:
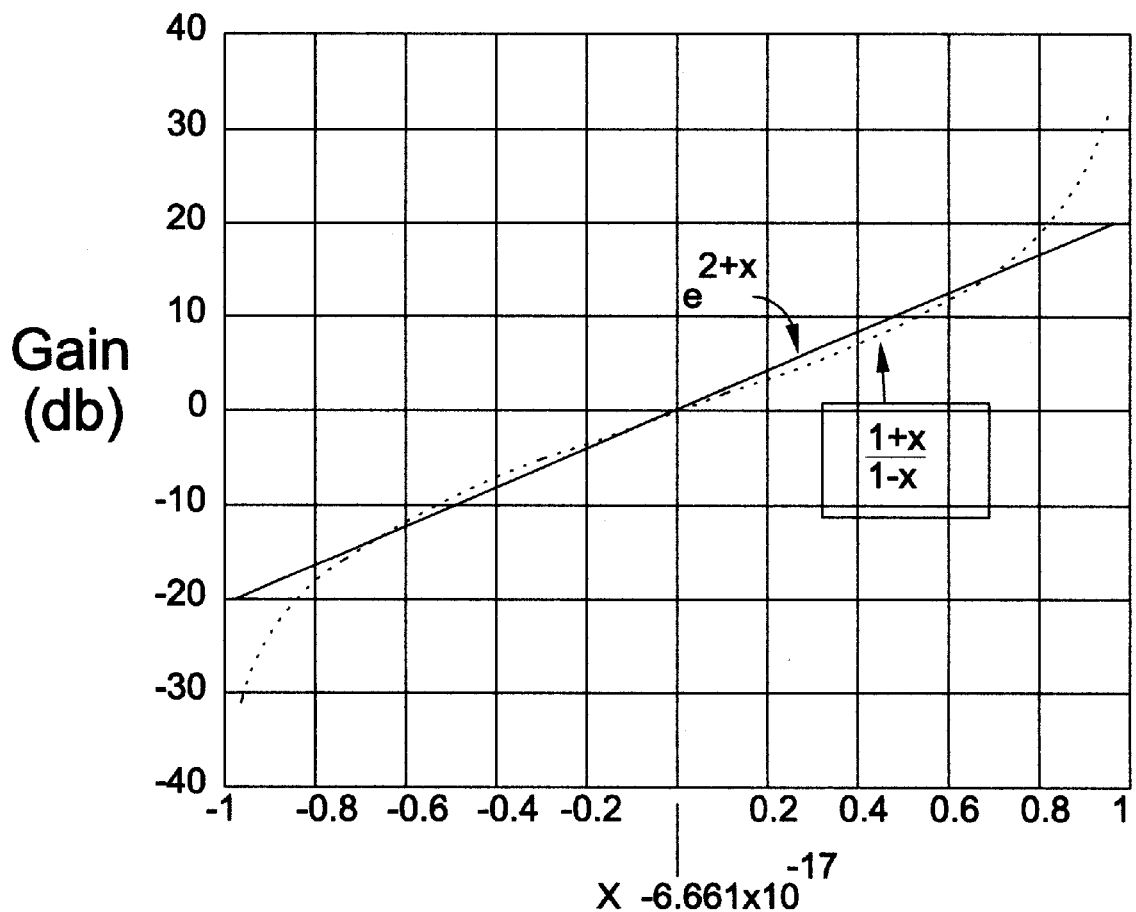
FIG. 3 is a graph of gain which can be achieved employing the circuit illustrated in FIG. 1, in a range where the gain is generally logarithmic.

As shown in FIG. 3, in the range −0.7<x<0.7, the gain in dβ (20 log $I_{out}/I_{in}$) provided by the circuit 10 is generally logarithmic and approximates $e^{2.4x}$. Therefore, the circuit 10 provides an implementation to generate a generally logarithmic relationship which may be used in a CMOS environment. The circuit 10 uses a digital word to program parallel transistors to control gain.

As mentioned, providing a generally logarithmic transfer function is desirable in certain applications, such as in CMOS technology. It should be noted that while only an n-channel implementation of the present invention has been depicted and described herein, the present invention may also be used within a p-channel implementation. In fact, the invention may be implemented within almost any electronics environment because the structure relies more on device matching than on device characteristics.

As mentioned, it is desirable to implement the circuit 10 within a programmable gain amplifier. Such an implementation is depicted in FIG. 4. The circuit 40 illustrated in FIG. 4 is a programmable gain amplifier which employs circuit 10, illustrated in FIG. 1 and discussed hereinabove, to implement a logarithmic transfer function.

The circuit 40 illustrated in FIG. 4 works as follows. The differential input, $V_{in}$, is converted to a differential output current via the circuit block labeled "gm1". The voltage-to-current gain is the value of gm1. This differential current output is then input into circuit 10 (the leftmost circuit 10 appearing in FIG. 4). The output of circuit 10 is given by equation (C) and (D), presented above. The first section of circuitry (gm1 and the leftmost circuit 10) is followed by a similar section, labeled "gm2" and another circuit 10 (the rightmost circuit 10 appearing in FIG. 4). The input/output of this section are the same as described above with relation to the first section of circuitry. The output of the second instance (rightmost) of circuit 10 is connected to the inputs of the gm2 circuit block. This circuit 40 arrangement yields the following transfer function:

$$V_{out}/V_{in}=\{gm1*[(1-x)/(1+x)]\}/\{gm2*[(1-x)/(1+x)]\}$$

where the value x in the numerator is controlled by Bit0–BitN, and the value x in the denominator is controlled by BitN+1–Bit2N.

While two dividers are shown to implement a general implementation, one having ordinary skill in the art should understand that it is only necessary to have one of the dividers to implement a programmable gain amplifier.

While a preferred embodiment of the present invention is shown and described, it is envisioned that those skilled in the art may devise various modifications of the present invention without departing from the spirit and scope of the appended claims.

What is claimed is:

1. A circuit for generating a generally logarithmic transfer function controlled by switching signals provided to the circuit, said circuit comprising:
    a plurality of transistors;
    a plurality of switches, respectively operatively connected to each transistor in a programmable set; and
    a plurality of lines for carrying switching signals to said switches thereby selecting which of said transistors contribute to said generally logarithmic transfer function.

2. The circuit of claim 1, wherein said transistors are arranged parallel to each other.

3. The circuit of claim 1, wherein said switching signals comprises digital code.

4. The circuit of claim 1, wherein said circuit comprises a portion of a programmable gain amplifier, wherein said switching signals control a gain of said programmable gain amplifier, and wherein said gain can be generally logarithmic as a result of which transistors are selected to contribute to said generally logarithmic transfer function.

5. The circuit of claim 1, wherein said plurality of transistors comprises two sets of transistors, wherein each set of transistors comprises a plurality of transistors each having a different value.

6. The circuit of claim 5, wherein said transistors of each set are arranged parallel to each other.

7. The circuit of claim 5, wherein the values of said transistors provide that said transfer function can be generally logarithmic.

8. A programmable gain amplifier for generating a generally logarithmic gain controlled by digital code, said programmable gain amplifier comprising:
    a plurality of sets of transistors arranged in parallel, wherein the transistors of each set have values which are different from each other;
    a plurality of switches, respectively, operatively connected to each transistor in a programmable set; and
    a plurality of lines for carrying a digital code to said switches thereby selecting which of said transistors contribute to said generally logarithmic gain wherein said digital code controls the gain of said programmable gain amplifier, and wherein said gain can be generally logarithmic as a result of which transistors are selected to contribute to said generally logarithmic gain.

9. The programmable gain amplifier of claim 8, wherein each of said sets of transistors are associated with a transistor providing a unit value.

10. The programmable gain amplifier of claim 8, wherein the values of the transistors in each set of transistors are such that when all the transistors of said set are selected to contribute to said generally logarithmic gain, the set of transistors provides a gain having a value approaching m, wherein each of said transistors in the set has a value which is generally a multiple of ½ m thereby providing that said gain can be generally logarithmic.

11. A method of using a circuit to generate a generally logarithmic transfer function based upon switching signals, wherein said circuit includes a plurality of transistors, a plurality of switches, respectively operatively connected to each transistor in a programmable set, and a plurality of lines for carrying switching signals to said switches, said method comprising:

providing switching signals to said switches of said circuit to select which of said transistors contribute to said generally logarithmic transfer function.

12. The method of claim 11, wherein said transistors are arranged parallel to each other.

13. The method of claim 11, wherein said switching signals comprises a digital code.

14. The method of claim 11, wherein said circuit comprises a portion of a programmable gain amplifier, wherein said switching signals control a gain of said programmable gain amplifier, and wherein said gain can be generally logarithmic as a result of values of said transistors which are selected to contribute to said generally logarithmic transfer function.

15. The method of claim 11, wherein said plurality of transistors comprises two sets of transistors, wherein each set of transistors comprises a plurality of transistors each having a different value.

16. The method of claim 15, wherein said transistors of each set are arranged parallel to each other.

17. The method of claim 15, wherein the values of said transistors provide that said gain can be generally logarithmic.

18. A method of using a programmable gain amplifier to generate a generally logarithmic gain based upon a digital code, wherein said programmable gain amplifier includes a plurality of sets of transistors arranged in parallel, wherein the transistors of each set have values which are different from each other, a plurality of switches, respectively operatively connected to each transistor in a programmable set, and a plurality of lines for carrying a digital code to said switches, said method comprising:

providing a digital code to said plurality of lines to select which of said transistors contribute to said generally logarithmic gain, wherein said digital code controls the gain of said programmable gain amplifier, and wherein said gain can be generally logarithmic as a result of values of said transistors which are selected to contribute to said generally logarithmic gain.

19. The method of claim 18, wherein each of said sets of transistors are associated with a transistor providing a unit value.

20. The method of claim 19, wherein the values of the transistors in each set of transistors are such that when all the transistors of said set are selected to contribute to said generally logarithmic gain, the set of transistors provides a gain having a value approaching m, wherein each of said transistors in the set has a value which is generally a multiple of ½ m thereby providing that said gain can be generally logarithmic.

* * * * *